(12) United States Patent
Kim et al.

(10) Patent No.: US 12,068,042 B2
(45) Date of Patent: Aug. 20, 2024

(54) MULTI TIME PROGRAM DEVICE WITH POWER SWITCH AND NON-VOLATILE MEMORY

(71) Applicant: SK keyfoundry Inc., Cheongju-si (KR)

(72) Inventors: Jin Hyung Kim, Goyang-si (KR); Sung Bum Park, Seongnam-si (KR); Kee Sik Ahn, Hwaseong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 339 days.

(21) Appl. No.: 17/544,260

(22) Filed: Dec. 7, 2021

(65) Prior Publication Data

US 2023/0070554 A1 Mar. 9, 2023

(30) Foreign Application Priority Data

Aug. 24, 2021 (KR) .................. 10-2021-0111857

(51) Int. Cl.
*G11C 16/30* (2006.01)
*G11C 16/08* (2006.01)
*G11C 16/10* (2006.01)
*G11C 16/16* (2006.01)

(52) U.S. Cl.
CPC .............. *G11C 16/30* (2013.01); *G11C 16/08* (2013.01); *G11C 16/10* (2013.01); *G11C 16/16* (2013.01)

(58) Field of Classification Search
CPC ......... G11C 16/16; G11C 16/10; G11C 16/08; G11C 16/30

USPC ..................................................... 365/185.23
See application file for complete search history.

(56) References Cited

U.S. PATENT DOCUMENTS

| | | | | |
|---|---|---|---|---|
| 5,548,146 | A * | 8/1996 | Kuroda | G11C 16/0491 257/E27.103 |
| 6,418,060 | B1 * | 7/2002 | Yang | G11C 16/10 257/E27.103 |
| 11,017,851 | B1 * | 5/2021 | Prabhakar | H01L 29/7923 |
| 2005/0219913 | A1 * | 10/2005 | Choi | G11C 16/0466 365/185.29 |
| 2009/0310405 | A1 * | 12/2009 | Lee | G11C 16/12 365/189.11 |
| 2013/0242672 | A1 * | 9/2013 | Tran | G11C 16/3418 365/185.29 |
| 2016/0261270 | A1 | 9/2016 | Kim et al. | |
| 2017/0207231 | A1 * | 7/2017 | Kim | G11C 16/0433 |
| 2018/0068735 | A1 * | 3/2018 | Hirose | G11C 29/50004 |
| 2020/0091168 | A1 * | 3/2020 | Hsu | G11C 7/24 |

FOREIGN PATENT DOCUMENTS

KR 10-2011 0114875 A 10/2011

* cited by examiner

*Primary Examiner* — Sung Il Cho
(74) *Attorney, Agent, or Firm* — NSIP Law

(57) ABSTRACT

A multi time program device with a power switch and a non-volatile memory implementing the power switch for multi time program is provided. The device performs a program operation or an erase operation of a non-volatile memory cell in a non-volatile memory device.

19 Claims, 7 Drawing Sheets

MULTI TIME PROGRAM DEVICE WITH POWER SWITCH AND NON-VOLATILE MEMORY

CROSS-REFERENCE TO RELATED APPLICATION

This application claims the benefit under 35 U.S.C. § 119 of Korean Patent Application No. 10-2021-0111857, filed on Aug. 24, 2021, in the Korean Intellectual Property Office, the entire disclosures of which are incorporated herein by reference for all purposes.

BACKGROUND

1. Field

The following disclosure relates to a Multi-Time Program (MTP) with a power switch and a non-volatile memory device.

2. Description of Related Art

A non-volatile memory device may operate with a voltage that is the same as a power voltage applied to a circuit when performing a read operation. However, when performing a programming operation and an erase operation, in order to inject or remove a charge to a floating gate surrounded by an insulating film, a positive voltage that is higher than a power voltage, and a negative voltage that is lower than a ground voltage are desired. Therefore, a circuit that applies a voltage to a floating gate has to output a positive voltage and a negative voltage, in addition to a power voltage and a ground voltage.

Typically, when a positive voltage and a negative voltage are applied that are larger than a drain-body breakdown voltage of a transistor, a drain-body breakdown phenomenon is prevented, applying a positive voltage and a negative voltage. However, a positive voltage or a negative voltage may be selected and applied for an output node, but it is not possible to select and apply one of two negative voltages, which may be problematic.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In a general aspect, a non-volatile memory device includes a power generator, configured to generate a first positive voltage and a second positive voltage, and generate a first negative voltage and a second negative voltage; a power switch, comprising: a positive voltage switching device, configured to supply the first positive voltage and the second positive voltage; and a negative voltage switching device, configured to supply the first negative voltage and the second negative voltage; a Tunnel Gate (TG) driver, configured to receive one of the first positive voltage and the second positive voltage, and one of the first negative voltage and the second negative voltage, a Control Gate (CG) driver, configured to receive another of the first positive voltage and the second positive voltage, and another of the first negative voltage and the second negative voltage, a cell array, comprising a plurality of non-volatile memory cells in which an erase operation or a program operation is performed; wherein the erase operation and the program operation are performed by the CG driver and the TG driver, and in the erase operation the first positive voltage and the first negative voltage are supplied to the TG driver, and the second positive voltage and the second negative voltage are supplied to the CG driver.

The power generator may be configured to generate Vpp as the first positive voltage, generate Vpp/3 as the second positive voltage, generate −Vpp/3 as the first negative voltage, and generate −Vpp as the second negative voltage.

The first positive voltage may be generated to have a larger value than a value of the second positive voltage, and the first negative voltage is generated to have a value larger than a value of the second negative voltage in the power generator.

In the program operation, the second positive voltage and the second negative voltage may be supplied to the TG driver, and the first positive voltage and the first negative voltage may be supplied to the CG driver.

The positive voltage switching device may include a TG positive voltage unit; and a CG positive voltage unit, wherein the negative voltage switching device may include: a TG negative voltage unit; and a CG negative voltage unit.

In the erase operation, the power switch may be configured to supply the first positive voltage from the TG positive voltage unit, supply the first negative voltage from the TG negative voltage unit, supply the second positive voltage from the CG positive voltage unit, and supply the second negative voltage from the CG negative voltage.

In the program operation, the power switch may be configured to supply the second positive voltage from the TG positive voltage unit, supply the second negative voltage from the TG negative voltage unit, supply the first positive voltage from the CG positive voltage unit, and supply the first negative voltage from the CG negative voltage.

In a general aspect, a power switch includes a positive voltage switching device, configured to supply different positive voltages to a Control Gate (CG) driver and a Tunnel Gate (TG) driver; and a negative voltage switching device, configured to supply different negative voltages to the CG driver and the TG driver.

The positive voltage switching device may include a TG positive voltage unit, configured to supply one of a first positive voltage and a second positive voltage to the TG driver; and a CG positive voltage unit, configured to supply another of the first positive voltage and the second positive voltage to the CG driver.

The first positive voltage may be configured to have a higher value than a value of the second positive voltage.

In an erase mode, the positive voltage switching device may be configured to supply the first positive voltage to the TG driver, and supply the second positive voltage to the CG driver, and in a program mode, the positive voltage switching device may be configured to supply the first positive voltage to the CG driver and supply the second positive voltage to the TG driver.

The negative voltage switching device may include: a TG negative voltage unit, configured to supply one of a first negative voltage and a second negative voltage to the TG driver; and a CG negative voltage unit, configured to supply another of the first negative voltage and the second negative voltage to the CG driver.

The first negative voltage may be configured to have a higher value than a value of the second negative voltage.

In an erase mode, the negative voltage switching device may be configured to supply the first negative voltage to the TG driver and supply the second negative voltage to the CG driver, and wherein in a program mode, the negative voltage switching device may be configured to supply the first negative voltage to the CG driver and supply the second negative voltage to the TG driver.

The positive voltage switching device may include four modules that are composed of three P-type transistors and two N-type transistors, wherein each source terminal of the two N-type transistor is connected to a ground in each of the four modules, and wherein each source terminal of the three P-type transistors is connected to one of a power supply (PS) and an output terminal that respectively supplies the first positive voltage and the second positive voltage in each of the four modules.

In a general aspect, a non-volatile memory device includes a power generator, configured to generate positive voltages and negative voltages; a cell array; a power switch; a Tunnel Gate (TG) driver; and a Control Gate (CG) driver; wherein, in an erase operation of the cell array, the power switch is configured to supply a first positive voltage and a first negative voltage to the TG driver, and supply a second positive voltage and a second negative voltage to the CG driver, and wherein, in a program operation of the cell array, the power switch is configured to supply the second positive voltage and the second negative voltage to the TG driver, and supply the first positive voltage and the first negative voltage to the CG driver.

The power switch may further include a positive voltage switching device, configured to supply the first positive voltage and the second positive voltage, and a negative voltage switching device, configured to supply the first negative voltage and the second negative voltage.

A value of the first positive voltage may be greater than a value of the second positive voltage.

A value of the first negative voltage may be greater than a value of the second negative voltage.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
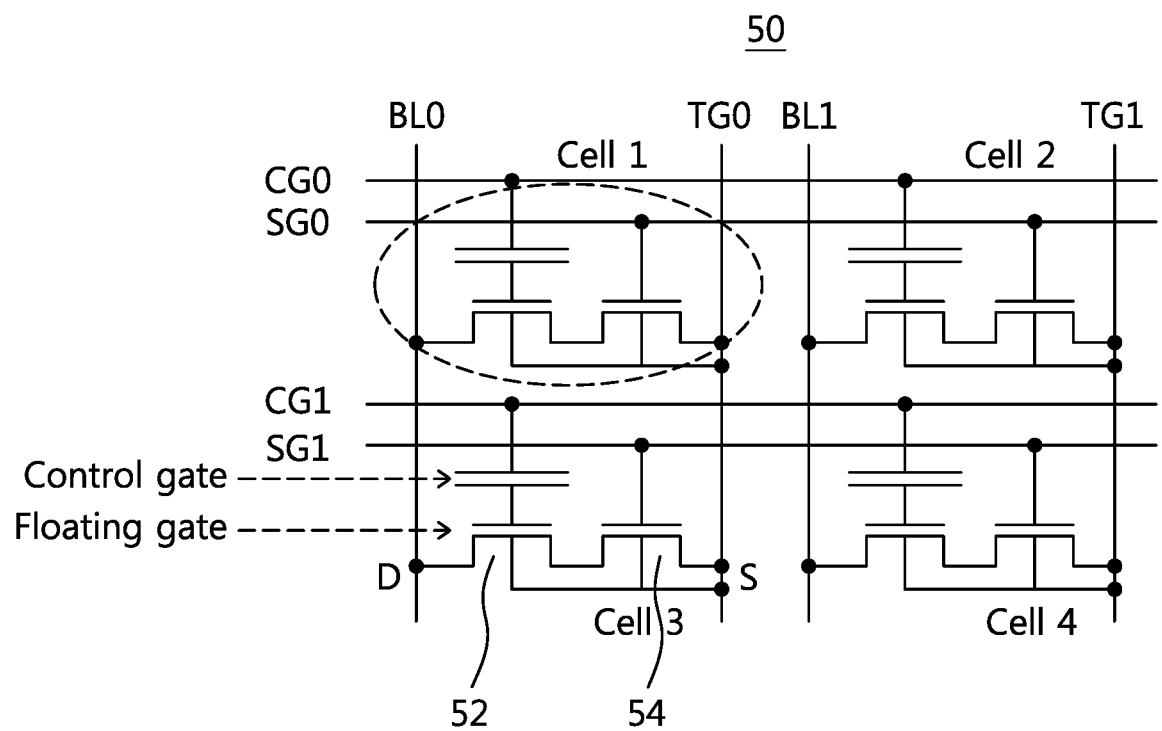
FIG. 1 illustrates an example structure of a cell array including a non-volatile memory cell, in accordance with one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

A targeted problem of the disclosure is not limited by the problems which are mentioned above, and other problems may be understood by a person skilled in the relevant field of technology, from the following description.

A detailed description for the disclosure is given below, with attached drawings.

FIG. 1 illustrates an example structure of a cell array including a non-volatile memory cell, in accordance with one or more embodiments.

Referring to FIG. 1, a cell array may include at least 4 memory cells (Cell 1, Cell 2, Cell 3, Cell 4). In an example, a cell may be disposed 2×2 in a cell array 50. Each memory cell may include a capacitor, a sensing transistor 52, and a selection transistor 54. Although a 2×2 cell array is illustrated in FIG. 1, this is only an example, and the cells may be disposed in cell arrays of various sizes, for example, a 3×3 cell array, a 4×4 cell array, etc.

The sensing transistor 52 may include a floating gate (FG) and a drain terminal D. A floating gate (FG) is also referred to as a sensing gate. A selection transistor 54 may include a selection gate and a source terminal S. The sensing transistor 52 and the selection transistor 54 may be formed on a same, first well region.

The capacitor may include a control gate (CG). The control gate (CG) may also be formed on a second well region which is separated from the first well region. The control gate (CG) and the floating gate (FG) may be physically and electrically connected to each other by a conductive film.

In a program operation, a charge may be charged from the second well region to the control gate (CG) and the floating gate (FG). On the contrary, in an erase operation, a charge may be discharged from the floating gate (FG) to the first well region.

Additionally, the cell array 50 may include a plurality of control gate lines CG0, CG1 connected to a capacitor structure; a plurality of tunnel gate lines TG0, TG1 connected to a source terminal S of a selection transistor 54; a plurality of selection gate lines SG0, SG1 connected to the selection gate of a selection transistor 54; and a plurality of bit lines BL0, BL1 connected to a drain terminal D of a sensing transistor 52.

In an example, a tunnel gate line TG0 may be electrically connected to a first well region. The control gate line CG0 may be electrically connected to a second well region. When a voltage is applied to the tunnel gate line TG0, the applied voltage may be the same as a voltage that is applied to the first well region. When a voltage is applied to the control gate line CG0, the applied voltage may be the same as a voltage that is applied to the second well region. In the one or more examples, the first well region and the second well region may be electrically separated.

In an example, Cell 1 and Cell 2 may share a control gate line CG0, and Cell 3 and Cell 4 may share a control gate line CG1. In an example, Cell 1 and Cell 3 may share a tunnel gate line TG0 and a bit line BL0, and Cell 2 and Cell 4 may share a tunnel gate line TG1 and a bit line BL1.

The tunnel gate line TG0, TG1 may be connected to a source terminal and a pick up terminal of a selection transistor 54, and accordingly, the tunnel gate line TG0, TG1 may be referred to as a source line SL0, SL1. A voltage applied to the tunnel gate line TG0, TG1 may be a voltage applied to a first well region formed in a substrate, and it may be considered to be a well bias.

Therefore, an entry and exit of a charge may be applied to a tunnel gate insulating film and a floating gate (or a sensing gate, or control gate) formed on a first well region.

When electrons are charged in a floating gate (or a sensing gate, or control gate), a program operation (PGM) may occur.

When electrons escape from a floating gate (or a sensing gate, or control gate), an erase operation (ERS) may occur.

In an example, when a positive program voltage, +Vpp is applied to CG0, and a negative program voltage, −Vpp is applied to TG0, a program operation may occur in Cell 1. On the contrary, when a negative program voltage (−Vpp) is applied to CG0, and a positive program voltage (+Vpp) is applied to TG0, an erase operation may occur in Cell 1. In an example, a ground voltage, 0V, may be applied to a SG0, SG1, and a BL0 may maintain a floating state.

In a standby state, a SG0, SG1, BL0, and BL1, etc. may be applied with a ground voltage or a floating state, it may be possible to apply a voltage related to a read voltage that is desired for a read operation.

Accordingly, it may be possible to stably supply a voltage that is desired to erase or program an NVM (Single Poly EEPROM or MTP) cell to each node of a non-volatile memory cell. Without an additional mask for only an NVM in a logic or BCD process, it may be possible to erase or program a non-volatile memory cell. Additionally, a development period may be shortened, since the number of processes may be reduced in a product where an NVM is applied.

A Multi-Time Programmable (MTP) memory cell or a Single-Poly Electrically Erasable Programmable Read Only Memory (EEPROM) cell may erase and write data electrically. Data may be preserved even if a power voltage is off, and an erase operation and program operation may be electrically possible by implementing a tunneling. Therefore, it may be possible to change information of a user.

Table 1 below illustrates an operational condition of a non-volatile memory cell.

TABLE 1

| Mode | | SG(WL) | CG | TG | BL | DNW |
|---|---|---|---|---|---|---|
| ERS | Selected(Cell1) | 0.0 | −Vpp | Vpp | Floating | Vpp |
| | Unselected(Cell2) | 0.0 | −Vpp | −Vpp/3 | Floating | Vpp |
| | Unselected(Cell3) | 0.0 | +Vpp/3 | Vpp | Floating | Vpp |
| | Unselected(Cell4) | 0.0 | +Vpp/3 | −Vpp/3 | Floating | Vpp |
| PGM | Selected(Cell1) | 0.0 | Vpp | −Vpp | Floating | Vpp |
| | Unselected(Cell2) | 0.0 | Vpp | +Vpp/3 | Floating | Vpp |
| | Unselected(Cell3) | 0.0 | −Vpp/3 | −Vpp | Floating | Vpp |
| | Unselected(Cell4) | 0.0 | −Vpp/3 | +Vpp/3 | Floating | Vpp |

Referring to Table 1, voltages are illustrated that are desired for an erase operation and a program operation of Cell 1, which is selected in FIG. 1, and other cells (Cell 2, Cell 3, Cell 4). In Table 1, the SG means selection gate line SG0 or SG1, and the CG means control gate line means CG0 or CG1. The TG means tunnel gate line TG0 or TG1.

In an erase (ERS) mode, for Cell 1, as a selected cell, a −Vpp and a +Vpp voltage may be respectively applied to CG and TG. In Cell 4, for an unselected cell, a +Vpp/3 and a −Vpp/3 voltage may be respectively applied to CG and TG.

In an erase (ERS) mode, with regard to the control gate line (CG0 or CG1), a −Vpp voltage may be applied to Cell 1 and Cell 2. A +Vpp/3 voltage may be applied to Cell 3 and Cell 4. A −Vpp or a +Vpp/3 voltage may be desired for a CG.

In an erase (ERS) mode, with regard to the tunnel gate line (TG0 or TG1), a +Vpp voltage may be applied to Cell 1 and Cell 3. A −Vpp/3 voltage may be applied to Cell 2 and Cell 4. A +Vpp or −Vpp/3 voltage may be desired for a TG.

In a program (PGM) mode, for Cell 1, as a selected cell, a +Vpp and a −Vpp voltage may be applied respectively to CG and TG. In Cell 4, for an unselected cell, a −Vpp/3 and a +Vpp/3 voltage may be applied respectively to CG and TG.

In a program (PGM) mode, with regard to a control gate line (CG0 or CG1), a +Vpp voltage may be applied to a CG of Cell 1 and Cell 2. A −Vpp/3 voltage may be applied to a CG of Cell 3 and Cell 4. A +Vpp or −Vpp/3 may be desired for a CG.

In a program (PGM) mode, with regard a tunnel gate line (TG0 or TG1), a −Vpp voltage may be applied to a TG of Cell 1 and Cell 3. A +Vpp/3 voltage may be applied to a TG of Cell 2 and Cell 4. A −Vpp or a +Vpp/3 voltage may be desired for a TG.

In the examples, a +Vpp and a Vpp/3 voltage may be desired in a CG as a positive voltage, and a −Vpp and a −Vpp/3 voltage may be desired as a negative voltage. Likewise, a +Vpp and a Vpp/3 voltage may be also desired in a TG, and a −Vpp and a −Vpp/3 voltage may be desired as a negative voltage. The following description relates to a structure of a non-volatile memory device to supply those 2 positive voltages and 2 negative voltages.

Figure 2:
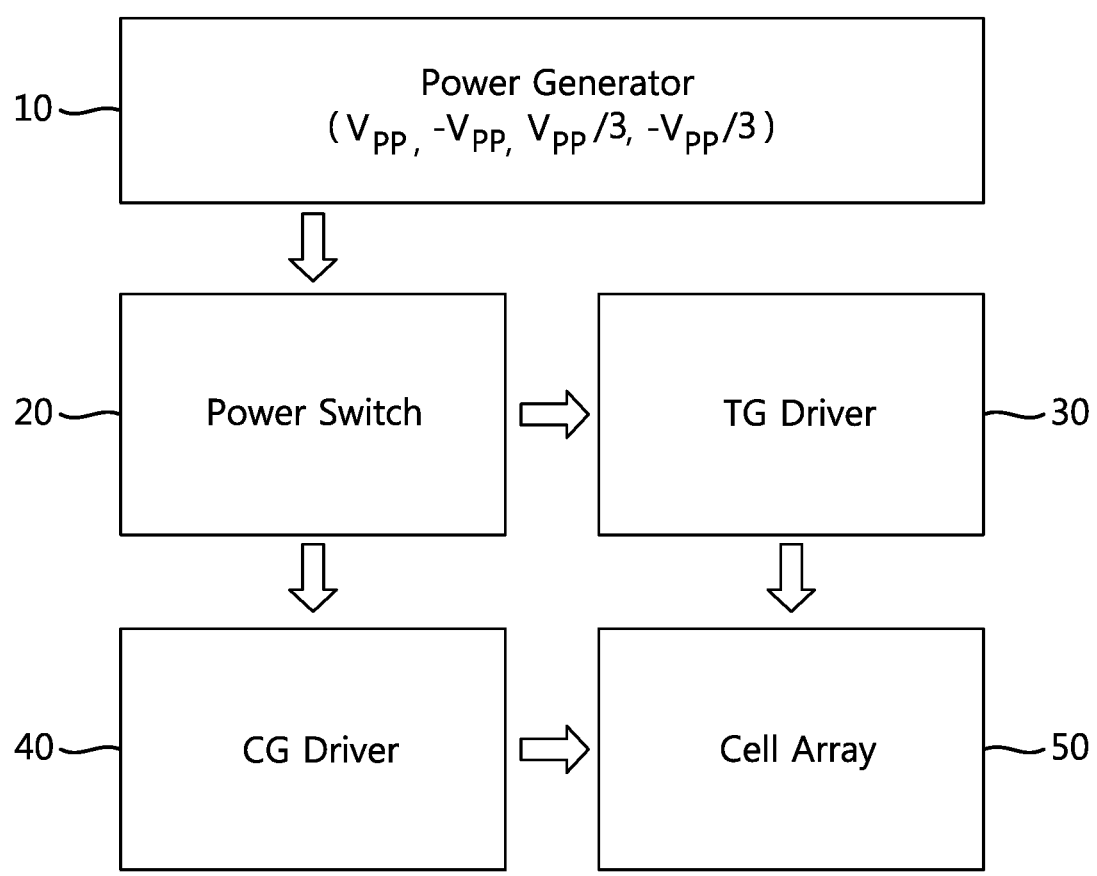
FIG. 2 illustrates an example composition of a non-volatile memory device in accordance with one or more embodiments.

FIG. 2 illustrates an example composition of a non-volatile memory device, in accordance with one or more embodiments.

Referring to FIG. 2, a non-volatile memory device in accordance with one or more embodiments may include a power generator 10, a power switch 20, a TG driver 30, a CG driver 40, and a cell array 50. The non-volatile memory device may control the power switch 20 according to a program mode and an erase mode, and accordingly, the power switch may apply a voltage to the non-volatile memory device of a cell array 50 that is desired for a program operation or an erase operation.

The power generator 10 may generate a first and a second positive voltage, and a first and a second negative voltage. In an example, the first positive voltage may be generated to be larger than the second positive voltage, and the first negative voltage may be generated to be larger than the second negative voltage in the power generator 10. In an example, the power generator 10 may generate various voltages as illustrated in Table 2 below.

TABLE 2

| Items | Applied voltage |
| --- | --- |
| A first positive voltage | $+V_{PP}$ |
| A second positive voltage | $V_{PP}/3$ |

TABLE 2-continued

| Items | Applied voltage |
| --- | --- |
| A first negative voltage | $-V_{PP}/3$ |
| A second negative voltage | $-V_{PP}$ |

A negative voltage and a positive voltage may be supplied to a non-volatile memory cell of the cell array 50, by controlling the power switch 20 to select a negative voltage and a positive voltage.

The power switch 20 may include a positive voltage switching device that is controlled to supply a first positive voltage and a second positive voltage, and a negative voltage switching device that is controlled to supply a first negative voltage and a second negative voltage.

The TG driver 30 may apply a voltage to a tunnel gate line TG0, TG1. A voltage may be applied to a first well region of a selection transistor 54. On the basis of a voltage being applied to the first well region of the selection transistor 54, a charge may be charged or discharged in a floating gate (FG) formed with a tunneling gate insulating film that is formed on a first well region interposed therebetween.

The CG driver may apply a voltage to a capacitor structure. As described earlier, the CG driver 40 may apply a voltage to the control gate line CG0, CG1.

The TG driver 30 and the CG driver 40 may be supplied with one positive voltage selected from a first and a second positive voltage and one negative voltage selected from a first and a second negative voltage that are generated by the power generator 10 through the power switch 20.

In an example, when a first positive voltage is supplied to the TG driver 30, a second positive voltage is supplied to the CG driver 40. Additionally, when a first negative voltage is supplied to the CG driver 40, a second negative voltage is supplied to the TG driver 30.

On the basis of a voltage applied to a selection transistor 54 and a capacitor structure, an erase operation or a program operation of a memory cell may be performed. That is, an erase operation or a program operation may be performed by the TG driver 30 and the CG driver 40 for a cell array 50 including a plurality of non-volatile memory cells.

Figure 3:
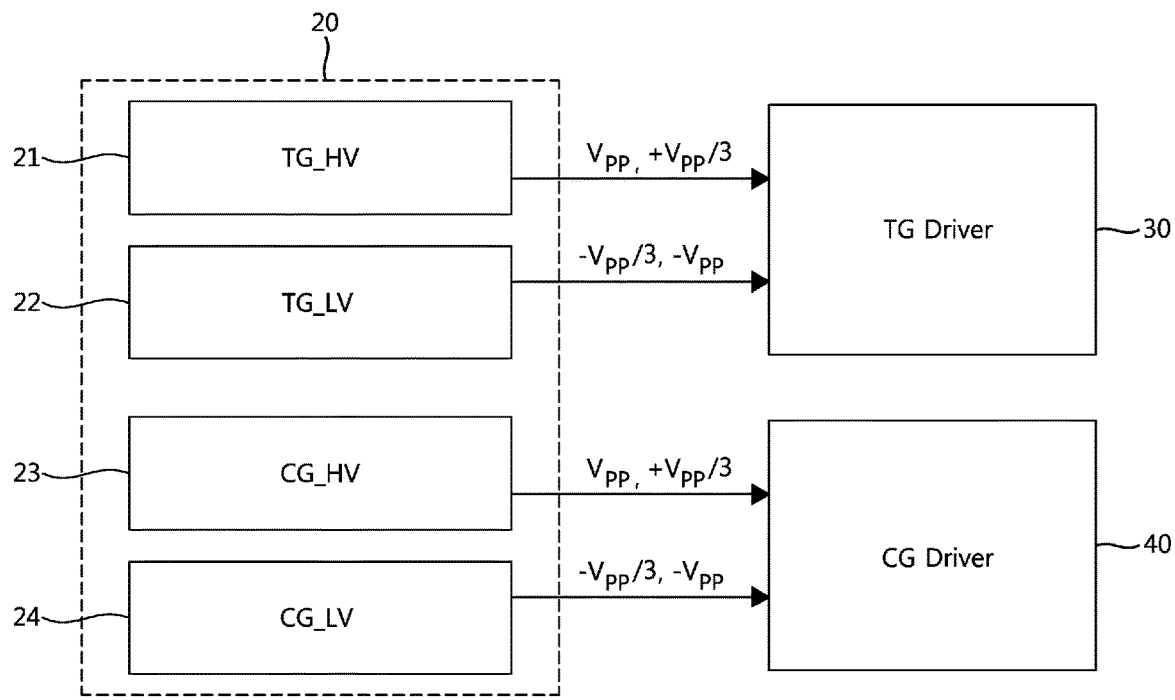
FIG. 3 illustrates an example composition of an example power switch including a positive voltage switching device and a negative voltage switching device in accordance with one or more embodiments.

FIG. 3 illustrates an example composition of an example power switch for a multi time program in accordance with one or more embodiments.

A power switch 20, in accordance with one or more embodiments, may include a TG positive voltage unit 21 (TG_HV), a TG negative voltage unit 22 (TG_LV), a CG positive voltage unit 23 (CG_HV), and a CG negative voltage unit 24 (CG_LV). The power switch 20 may be controlled to apply a voltage desired for a program operation or an erase operation.

In an example, the TG positive voltage unit 21 (TG_HV) may be controlled to supply one of a first positive voltage and a second positive voltage to the TG driver 30.

In an example, the TG negative voltage unit 22 (TG_LV) may be controlled to supply one of a first negative voltage and a second negative voltage to the TG driver 30.

In an example, the CG positive voltage unit 23 (CG_HV) may be controlled to supply one of a first positive voltage and a second positive voltage to the CG driver 40.

In an example, the CG negative voltage unit 24 (CG_LV) may be controlled to supply one of a first negative voltage and a second negative voltage to the CG driver 40.

A positive voltage switching device may include the CG positive voltage unit 23 (CG_HV) and the TG positive voltage unit 21 (TG_HV). A negative voltage switching device may include the CG negative voltage unit 24

(CG_LV) and the TG negative voltage unit 22 (TG_LV). Voltages may be supplied in an erase mode and a program mode, as illustrated in Table 3 below.

TABLE 3

| Switching device | Division | Erase mode | Program mode |
|---|---|---|---|
| Positive voltage switching device | TG positive voltage unit TG_HV | A first positive voltage $(+V_{PP})$ | A second positive voltage $(V_{PP}/3)$ |
| | CG positive voltage unit CG_HV | A second positive voltage $(V_{PP}/3)$ | A first positive voltage $(+V_{PP})$ |
| Negative voltage switching device | TG negative voltage unit TG_LV | A first negative voltage $(-V_{PP}/3)$ | A second negative voltage $(-V_{PP})$ |
| | CG negative voltage unit CG_LV | A second negative voltage $(-V_{PP})$ | A first negative voltage $(-V_{PP}/3)$ |

In an erase mode, the positive voltage switching device may be controlled to supply a first positive voltage to the TG driver 30, and to supply a second positive voltage to the CG driver 40. In the erase mode, the negative voltage switching device may be controlled to supply a first negative voltage to the TG driver 30, and to supply a second negative voltage to the CG driver 40.

In a program mode, the positive voltage switching device may be controlled to supply a second positive voltage to the TG driver 30, and to supply a first positive voltage to the CG driver 40. In the program mode, the negative voltage switching device may be controlled to supply a second negative voltage to the TG driver 30, and to supply a first negative voltage to the CG driver 40.

It may be desirable that a first positive voltage is implemented to be greater than a second positive voltage. In an example, Vpp may be applied as the first positive voltage, and Vpp/3 may be applied as the second positive voltage. However, this is only an example, and in an example, the first positive voltage may be implemented to be less than a second positive voltage.

In an erase mode, the negative voltage switching device may be controlled to supply a first negative voltage to the TG driver 30 and to supply a second negative voltage to the CG driver 40.

In a program mode, the negative voltage switching device may be controlled to supply a second negative voltage to a TG driver 30 and to supply a first negative voltage to a CG driver 40.

It may be desirable that the first negative voltage is implemented to be greater than the second negative voltage. In an example, −Vpp/3 may be applied as the first negative voltage, and −Vpp may be applied as the second negative voltage.

Figure 4:
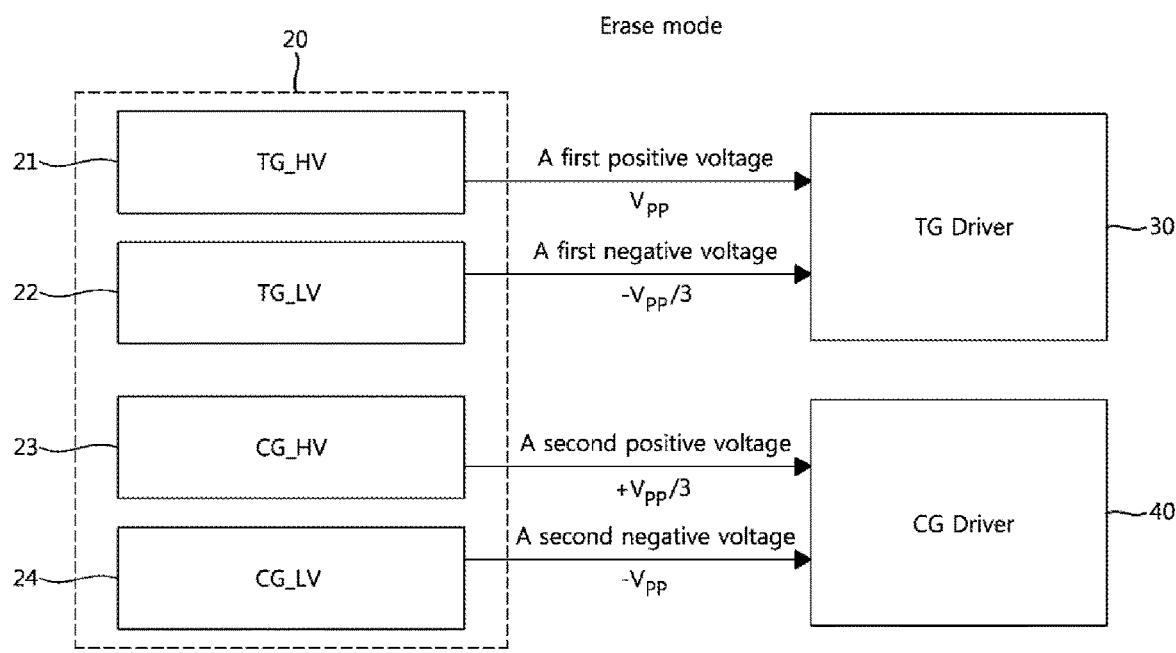
FIG. 4 illustrates a voltage provided from an example power switch for a multi time program in an erase mode in accordance with one or more embodiments.

FIG. 4 illustrates a voltage provided from an example power switch for a multi time program in an erase mode, in accordance with one or more embodiments.

In an erase mode, a first positive voltage and a first negative voltage may be supplied to a TG driver 30, and a second positive voltage and a second negative voltage may be supplied to a CG driver 40. In an example, a power switch 20 may be controlled to supply Vpp and −Vpp/3 to a TG driver 30 and to supply Vpp/3 and −Vpp to a CG driver 40.

Figure 5:
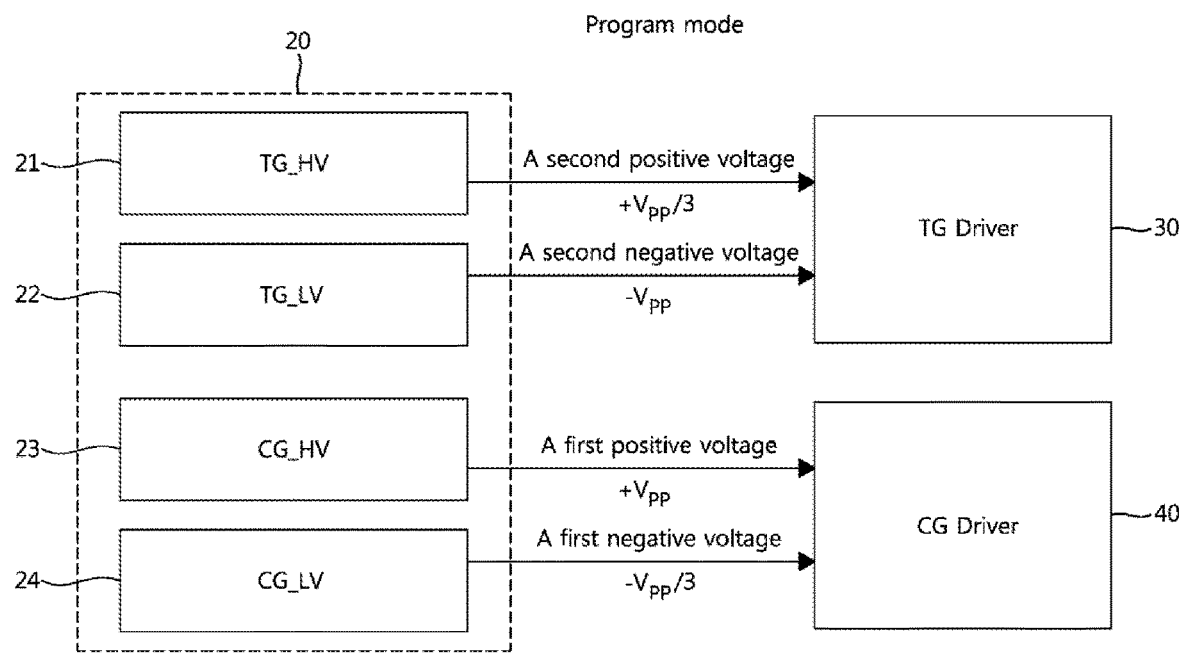
FIG. 5 illustrates a voltage provided from an example power switch for a multi time program in a program mode in accordance with one or more embodiments.

FIG. 5 illustrates a voltage provided from an example power switch for a multi time program in a program mode, in accordance with one or more embodiments.

In a program mode, the power switch 20 may be controlled to supply a second positive voltage and a second negative voltage to the TG driver 30, and to supply a first positive voltage and a first negative voltage to the CG driver 40. In an example, the power switch 20 may be controlled to supply Vpp/3 and −Vpp to the TG driver 30, and to supply Vpp and −Vpp/3 to the CG driver 40.

Figure 6:
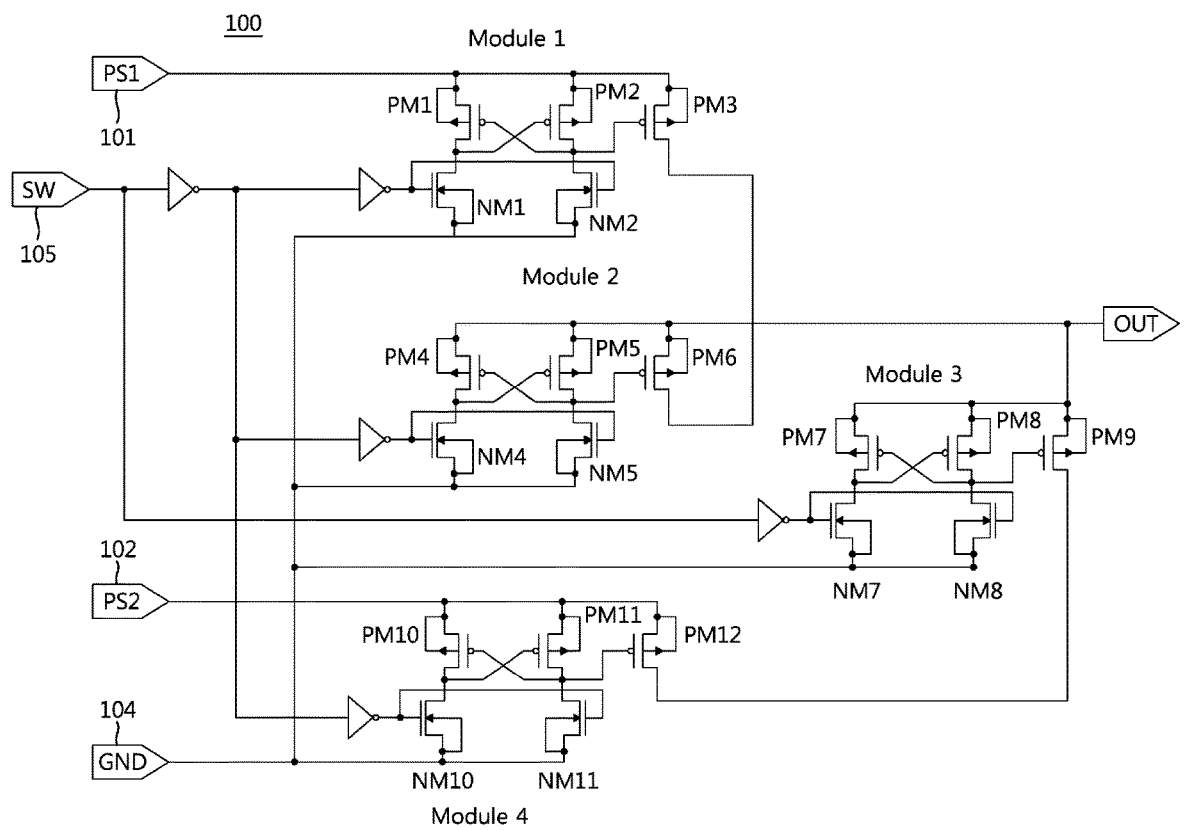
FIG. 6 illustrates an example composition of an example circuit that selects a positive voltage of a power switch for a multi time program.

FIG. 6 illustrates an example composition of an example circuit that selects a positive voltage of a power switch for a multi time program, in accordance with one or more embodiments.

Referring to FIG. 6, a positive voltage selection circuit (i.e., positive voltage switching device) 100 may comprise a first power supply (PS1) 101, a second power supply (PS2) 102, a ground terminal GND 104, a control signal (SW) 105, an output terminal OUT, and first to fourth modules (module 1 to 4).

A positive voltage selection circuit 100 may select one of a first power supply(PS1) 101 and a second power supply (PS2) 102, which are 2 different power supplies (PS), and deliver it to an output terminal OUT. For convenience, it is assumed that a first positive voltage is supplied from a PS1 101, and a second positive voltage is supplied from a PS2 102. In one or more examples, it may be desirable that a first positive voltage is greater than a second positive voltage. In an example, when a first positive voltage is Vpp, a second positive voltage may be Vpp/3.

In this example, a positive voltage may be delivered to an output terminal OUT by using a control signal. By controlling a SW 105, which is a positive control signal terminal, one of the PS1 101 and the PS2 102 may be delivered to an output terminal OUT.

In an example, the SW 105 may be a control signal to determine whether a positive voltage, between the PS1 101 and the PS2 102, is delivered to an output terminal OUT. When the SW 105 is logical "0", a first positive voltage may be delivered from the PS1 101 to the output terminal OUT. When the SW 105 is logical "1", a second positive voltage may be delivered from the PS2 102 to the output terminal OUT.

Furthermore, FIG. 6 illustrates that there are first to fourth modules (Module 1 to 4) in the positive voltage selection circuit 100. First module (Module 1) may comprise PM1, PM2, PM3, NM1 and NM2. Second module (Module 2) may comprise PM4, PM5, PM6, NM4 and NM5. Third module (Module 3) may comprise PM7, PM8, PM9, NM7 and NM8. Fourth module (Module 4) may comprise PM10, PM11, PM12, NM10 and NM11. Each module comprise three P-type transistors(PM) and two N-type transistors (NM). A source of two N-type transistors of each module may be connected to a ground GND. A source of three P-type transistors of each module may be connected to one of PS1 101, PS2 102, and the output terminal OUT.

Additionally, in FIG. 6, for two P-type transistors among the three P-type transistors of each transistor group, each drain may be connected to each drain of the two N-type transistors of the respective transistor group. For the remainder of the P-type transistors among the three P-type transistors, a drain of one of the P-type transistors of a first module may be connected to a drain of the remainder of the P-type transistors among the three P-type transistors located in another module. A gate of the remainder of the P-type transistors may be connected to a common node that is connected to two P-type transistors and two N-type transistors.

In FIG. 6, the PS1 101 may be connected to a source of a first P-type transistor PM1, a source of a second P-type transistor PM2, and a source of a third P-type transistor PM3.

In FIG. 6, the PS2 102 may be connected to a source of a tenth P-type transistor PM10, a source of an eleventh P-type transistor PM11, and a source of a twelfth P-type transistor PM12.

In FIG. 6, the output terminal OUT may be connected to each source of a fourth P-type transistor PM4, a fifth P-type transistor PM5, and a sixth P-type transistor PM6, and each source of a seventh P-type transistor PM7, an eighth P-type transistor PM8, and a ninth P-type transistor PM9.

In FIG. 6, the ground GND may be connected to each source of a first N-type transistor NM1 and a second N-type transistor NM2, each source of a fourth N-type transistor NM4 and a fifth N-type transistor NM5, each source of a seventh N-type transistor NM7 and a eighth N-type transistor NM8, and each source of a tenth N-type transistor NM10 and an eleventh N-type transistor NM11.

Additionally, referring to FIG. 6, each drain and gate of a first P-type transistor PM1, a second P-type transistor PM2, a first N-type transistor NM1, and a second N-type transistor NM2 may be connected to a common node. A gate of a third P-type transistor PM3 may be connected to the common node. In one or more examples, a drain of a third P-type transistor PM3 may be connected to a drain of a sixth P-type transistor PM6.

Additionally, referring to FIG. 6, each drain and gate of a fourth P-type transistor PM4, a fifth P-type transistor PM5, a fourth N-type transistor NM4, and a fifth N-type transistor NM5 may be connected to a common node. A gate of a sixth P-type transistor PM6 may be connected to the common node.

Additionally, referring to FIG. 6, each drain and gate of a seventh P-type transistor PM7, an eighth P-type transistor PM8, a seventh N-type transistor NM7, and an eighth N-type transistor NM8 may be connected to a common node. A gate of a ninth P-type transistor PM9 may be connected to the common node. In one or more examples, a drain of a ninth P-type transistor PM9 may be connected to a drain of a twelfth P-type transistor PM12.

Additionally, referring to FIG. 6, each drain and gate of a tenth P-type transistor PM10, an eleventh P-type transistor PM11, a tenth N-type transistor NM10, and an eleventh N-type transistor NM11 may be connected to a common node. A gate of a twelfth P-type transistor PM12 may be connected to the common node.

A TG positive voltage unit 21 and a CG positive voltage unit 23 may all select a first positive voltage or a second positive voltage, and a composition of a circuit may be identical to a positive voltage selection circuit 100. As described above, when the TG positive voltage unit 21 selects a first positive voltage, the CG positive voltage unit 23 selects a second positive voltage. When the TG positive voltage unit 21 selects a second positive voltage, the CG positive voltage unit 23 selects a first positive voltage.

Figure 7:
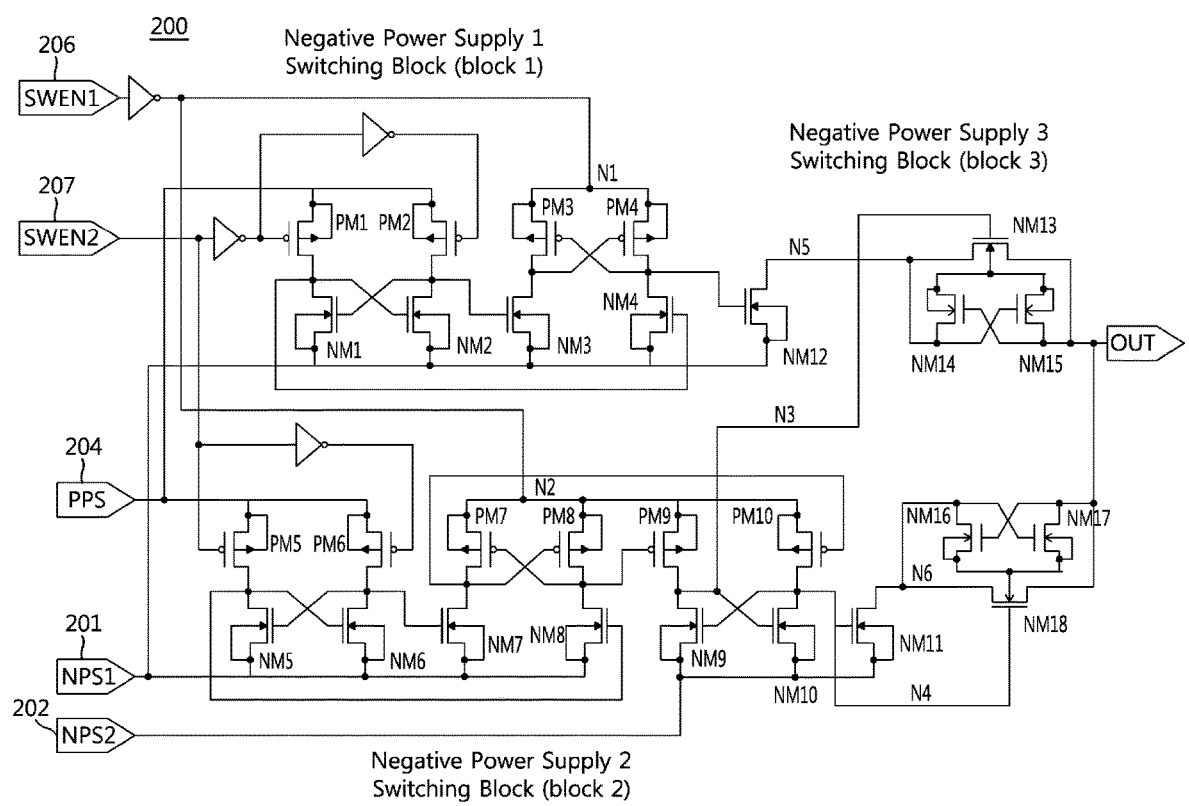
FIG. 7 illustrates an example composition of a circuit to select a negative voltage of a power switch for a multi time program.

FIG. 7 illustrates an example composition of an example circuit that selects a negative voltage of a power switch for a multi time program.

Referring to FIG. 7, a negative voltage selection circuit (i.e., negative voltage switching device) 200 may comprise a first negative power supply switching block (block 1), a second negative power supply switching block (block 2) and a third negative power supply switching block (block 3). The block 1 may comprise PM1 to PM4, NM1 to NM3, and NM12. The block 2 may comprise PM5 to PM10, and NM5 to NM11. The block 3 may comprise NM13 to NM15, and NM16 to NM18.

In FIG. 7, a negative voltage selection circuit 200 to select a negative voltage may select one of a negative first power supply (NPS1) 201 and a negative second power supply (NPS2) 202, which are 2 different negative power supplies (NPS) and deliver it to an output terminal OUT. For convenience, it is assumed that a first negative voltage is supplied from NPS1 101, and a second negative voltage is supplied from NPS2 102. In an example, it may be desirable that a first negative voltage is greater than a second negative voltage. In an example, when a second negative voltage is −Vpp, a first negative voltage may be −Vpp/3.

In this example, a negative voltage may be delivered to an output terminal OUT by using 2 control signals. By controlling a first control signal terminal SWEN1 206 and a second control signal terminal SWEN2 207, one of NPS1 201 and NPS2 202 may be delivered to an output terminal OUT.

A SWEN2 207 is a control signal that may determine which negative voltage, between NPS1 201 and NPS2, is delivered to an output terminal OUT. Additionally, a SWEN1 206 is a control signal used to normally supply an NPS to an output terminal OUT.

In an example, when a SWEN1 206 is logical "0", a power may not be delivered to an output terminal OUT, but when it is logical "1", a first negative voltage from an NPS1 201 or a second negative voltage from an NPS2 202 may be supplied. Additionally, when a SWEN2 207 is logical "0", a first negative voltage may be delivered from an NPS1 201 to an output terminal OUT, and when it is logical "1", a second negative voltage may be delivered from an NPS2 202 to an output terminal OUT.

In an example, an NPS1 201 may be delivered to an output terminal OUT by making a SWEN2 207 be logical "0".

In FIG. 7, by selecting an NPS1 201 and making a SWEN1 be logical "1", it may be possible to operate devices of a third P-type transistor PM3, a fourth P-type transistor PM4, a seventh P-type transistor PM7, an eighth P-type transistor PM8, a ninth P-type transistor PM9, a tenth P-type transistor PM10, a third N-type transistor NM3, a fourth N-type transistor NM4, a seventh N-type transistor NM7, an eighth N-type transistor NM8, a ninth N-type transistor NM9, and a tenth N-type transistor NM10 under a breakdown voltage.

In this example, in FIG. 7, 0V may be supplied to a common node of a third P-type transistor PM3 and a fourth P-type transistor PM4, and a common node of a seventh P-type transistor PM7, an eighth P-type transistor PM8, a ninth P-type transistor PM9, and a tenth P-type transistor PM10.

Accordingly, by turning on a twelfth N-type transistor NM12, a first negative voltage may be delivered to a common node of a fourteenth N-type transistor NM14 and a fifteenth N-type transistor NM15, according to an NPS1 201.

A node that is connected to a gate of a fourteenth N-type transistor NM14 may become 0V, resulting in the turning on of a thirteenth N-type transistor NM13. A first negative voltage may be delivered to an output terminal OUT according to an NPS1 101 delivered to a common node of a fourteenth N-type transistor NM14 and a fifteenth N-type transistor NM15.

A second negative voltage may be delivered to a node that is connected to a gate of an eighteenth N-type transistor NM18 according to an NPS2 102. An eleventh N-type transistor NM11 and an eighteenth N-type transistor NM18 may be off. A second negative voltage may not affect a first negative voltage.

Next, an NPS2 202 may be delivered to an output terminal OUT by making a SWEN2 207 be logical "1".

In this example, in FIG. 7, by selecting an NPS2 202 and making a SWEN1 be logical "1", it may be possible to operate devices of a third P-type transistor PM3, a fourth P-type transistor PM4, a seventh P-type transistor PM7, an eighth P-type transistor PM8, a ninth P-type transistor PM9, a tenth P-type transistor PM10, a third N-type transistor NM3, a fourth N-type transistor NM4, a seventh N-type transistor NM7, an eighth N-type transistor NM8, a ninth N-type transistor NM9, and a tenth N-type transistor NM10. The operation may be conducted under a breakdown voltage.

In this example, in FIG. 7, 0V may be supplied to a common node of a third P-type transistor PM3, a fourth P-type transistor PM4, and a common node of a seventh P-type transistor PM7, an eighth P-type transistor PM8, a ninth P-type transistor PM9, and a tenth P-type transistor PM10.

A node may become 0V that is connected to a gate of an eighteenth N-type transistor NM18, and therefore, an eleventh N-type transistor NM11 and an eighteenth N-type transistor NM18 may be turned on.

A second negative voltage may be delivered to an output terminal OUT according to an NPS2 202 that is delivered to a common node of an eleventh N-type transistor NM11, a sixteenth N-type transistor NM16 and an eighteenth N-type transistor NM18.

A second negative voltage according to an NPS2 202 may be delivered to a node where a gate of a thirteenth N-type transistor NM13 is connected, through an eleventh N-type transistor NM11.

By making a thirteenth N-type transistor NM13 and a twelfth N-type transistor NM12 off, a first negative voltage does not affect a second negative voltage.

A TG negative voltage selection unit 22 and a CG negative voltage selection unit 24 may all select a first negative voltage or a second negative voltage, and a composition of a circuit may be identical to a negative voltage selection circuit 200.

As described above, when a TG negative voltage selection unit 22 selects a first negative voltage, a CG negative voltage selection unit 24 selects a second negative voltage. When a TG negative voltage selection unit 22 selects a second negative voltage, a CG negative voltage selection unit 24 selects a first negative voltage.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A non-volatile memory device, comprising:
   a power generator configured to generate a first positive voltage and a second positive voltage less than the first positive voltage, and to generate a first negative voltage and a second negative voltage less than the first negative voltage;
   a power switch comprising:
      a positive voltage switching device configured to supply the first positive voltage and the second positive voltage according to a control signal, wherein when the control signal is a logic "0", the first positive voltage is output, and when the control signal is a logic "1", the second positive voltage is output; and
      a negative voltage switching device configured to supply the first negative voltage and the second negative voltage according to a first control signal and a second control signal, wherein when the first control signal is a logic "0", no power is output, and when the first control signal is a logic "1", the first or second negative voltage is output, and wherein when the second control signal is a logic "0", the first negative voltage is output, and when the second control signal is a logic "1", the second negative voltage is output;
   a Tunnel Gate (TG) driver configured to receive one of the first positive voltage and the second positive voltage, and one of the first negative voltage and the second negative voltage,
   a Control Gate (CG) driver configured to receive another of the first positive voltage and the second positive voltage, and another of the first negative voltage and the second negative voltage,
   a cell array comprising a plurality of non-volatile memory cells in which an erase operation or a program operation is performed;
   wherein the erase operation and the program operation are performed by the CG driver and the TG driver, and
   wherein, in the erase operation, the first positive voltage greater than the second positive voltage and the first negative voltage greater than the second negative voltage are supplied to the TG driver, and the second positive voltage and the second negative voltage are supplied to the CG driver.

2. The non-volatile memory device of claim 1, wherein the power generator is configured to generate Vpp as the first positive voltage, generate Vpp/3 as the second positive voltage, generate −Vpp/3 as the first negative voltage, and generate −Vpp as the second negative voltage, and
   wherein, in the program operation, the Vpp/3 and the −Vpp are supplied to the TG driver, and the Vpp and the −Vpp/3 are supplied to the CG driver.

3. The non-volatile memory device of claim 2, wherein each memory cell of the cell array comprises a sensing transistor including a floating gate and a drain terminal, a selection transistor including a selection gate and a source terminal, and a capacitor including a control gate, and
wherein the sensing transistor and the selection transistor are formed on a first well region, and the control gate is formed on a second well region separated from the first well region.

4. The non-volatile memory device of claim 1, wherein, in the program operation, the second positive voltage and the second negative voltage are supplied to the TG driver, and the first positive voltage and the first negative voltage are supplied to the CG driver.

5. The non-volatile memory device of claim 1, wherein the positive voltage switching device comprises:
a TG positive voltage unit; and
a CG positive voltage unit,
wherein the negative voltage switching device comprises:
a TG negative voltage unit; and
a CG negative voltage unit.

6. The non-volatile memory device of claim 5, wherein in the erase operation, the power switch is configured to supply the first positive voltage from the TG positive voltage unit, supply the first negative voltage from the TG negative voltage unit, supply the second positive voltage from the CG positive voltage unit, and supply the second negative voltage from the CG negative voltage.

7. The non-volatile memory device of claim 5, wherein in the program operation, the power switch is configured to supply the second positive voltage from the TG positive voltage unit, supply the second negative voltage from the TG negative voltage unit, supply the first positive voltage from the CG positive voltage unit, and supply the first negative voltage from the CG negative voltage.

8. A power switch, comprising:
a positive voltage switching device, configured to supply different positive voltages to a Control Gate (CG) driver and a Tunnel Gate (TG) driver according to a control signal,
wherein when the control signal is a logic "0", a first positive voltage is output, and when the control signal is a logic "1", a second positive voltage less than the first positive voltage is output; and
a negative voltage switching device, configured to supply different negative voltages to the CG driver and the TG driver according to a first control signal and a second control signal,
wherein when the first control signal is a logic "0", no power is output, and when the first control signal is a logic "1", a first negative voltage or a second negative voltage less than the first negative voltage is output, and
wherein when the second control signal is a logic "0", the first negative voltage is output, and when the second control signal is a logic "1", the second negative voltage is output.

9. The power switch of claim 8, wherein the positive voltage switching device comprises:
a TG positive voltage unit configured to supply one of a first positive voltage and a second positive voltage to the TG driver; and
a CG positive voltage unit configured to supply another of the first positive voltage and the second positive voltage to the CG driver.

10. The power switch of claim 9, wherein the first positive voltage is configured to have a higher value than a value of the second positive voltage.

11. The power switch of claim 9, wherein, in an erase mode, the positive voltage switching device is configured to supply the first positive voltage to the TG driver, and supply the second positive voltage to the CG driver, and
wherein, in a program mode, the positive voltage switching device is configured to supply the first positive voltage to the CG driver and supply the second positive voltage to the TG driver.

12. The power switch of claim 8, wherein the negative voltage switching device comprises:
a TG negative voltage unit configured to supply one of a first negative voltage and a second negative voltage to the TG driver; and
a CG negative voltage unit configured to supply another of the first negative voltage and the second negative voltage to the CG driver.

13. The power switch of claim 12, wherein the first negative voltage is configured to have a higher value than a value of the second negative voltage.

14. The power switch of claim 12, wherein, in an erase mode, the negative voltage switching device is configured to supply the first negative voltage to the TG driver and supply the second negative voltage to the CG driver, and
wherein, in a program mode, the negative voltage switching device is configured to supply the first negative voltage to the CG driver and supply the second negative voltage to the TG driver.

15. The power switch of claim 9, wherein the positive voltage switching device comprises a first power supply, a second power supply, and first through fourth modules each comprising three P-type transistors and two N-type transistors,
wherein each source terminal of the two N-type transistor is connected to a ground terminal in each of the four modules, and
wherein each source terminal of the three P-type transistors is connected to one of the first power supply, the second power supply, and an output terminal that respectively supplies the first positive voltage and the second positive voltage in each of the four modules.

16. A non-volatile memory device, comprising:
a power generator configured to generate positive voltages and negative voltages;
a cell array including a plurality of memory cells;
a power switch;
a Tunnel Gate (TG) driver; and
a Control Gate (CG) driver,
wherein, in an erase operation of the cell array, the power switch is configured to supply a first positive voltage and a first negative voltage to the TG driver, and supply a second positive voltage less than the first positive voltage and a second negative voltage less than the first negative voltage to the CG driver, and
wherein, in a program operation of the cell array, the power switch is configured to supply the second positive voltage and the second negative voltage to the TG driver, and supply the first positive voltage and the first negative voltage to the CG driver.

17. The non-volatile memory device of claim 16, wherein the power switch further comprises:
a positive voltage switching device, configured to supply the first positive voltage and the second positive voltage according to a control signal, wherein when the control signal is a logic "0", the first positive voltage is output, and when the control signal is a logic "1", the second positive voltage is output, and a negative voltage switching device, configured to supply the first negative voltage and the second negative voltage according to a first control signal and a second control signal,
wherein when the first control signal is a logic "0", no power is output, and when the first control signal is a logic "1", the first or second negative voltage is output, and
wherein when the second control signal is a logic "0", the first negative voltage is output, and when the second control signal is a logic "1", the second negative voltage is output.

18. The non-volatile memory device of claim 17, wherein the positive voltage switching device comprises a first power supply, a second power supply, and first through fourth modules each comprising three P-type transistors and two N-type transistors,
wherein each source terminal of the two N-type transistor is connected to a ground terminal in each of the four modules, and
wherein each source terminal of the three P-type transistors is connected to one of the first power supply, the second power supply, and an output terminal that respectively supplies the first positive voltage and the second positive voltage in each of the four modules.

19. The non-volatile memory device of claim 16, wherein each memory cell of the cell array comprises a sensing transistor including a floating gate and a drain terminal, a selection transistor including a selection gate and a source terminal, and a capacitor including a control gate.

* * * * *